United States Patent
Rinn et al.

(10) Patent No.: US 7,420,670 B2
(45) Date of Patent: Sep. 2, 2008

(54) MEASURING INSTRUMENT AND METHOD FOR OPERATING A MEASURING INSTRUMENT FOR OPTICAL INSPECTION OF AN OBJECT

(75) Inventors: Klaus Rinn, Heuchelheim (DE); Lambert Danner, Wetzlar (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 215 days.

(21) Appl. No.: 11/127,002

(22) Filed: May 11, 2005

(65) Prior Publication Data

US 2005/0254068 A1  Nov. 17, 2005

(30) Foreign Application Priority Data

May 12, 2004  (DE)  .................. 10 2004 023 739

(51) Int. Cl.
 *G01N 21/00*  (2006.01)
(52) U.S. Cl. .................. 356/237.4; 356/237.5; 356/635
(58) Field of Classification Search ... 356/237.4–237.5, 356/614
See application file for complete search history.

(56) References Cited

U.S. PATENT DOCUMENTS

| | | | | |
|---|---|---|---|---|
| 4,633,171 | A | * | 12/1986 | Storck et al. ............... 324/77 K |
| 5,859,424 | A | | 1/1999 | Norton et al. ............... 250/226 |
| 6,020,957 | A | * | 2/2000 | Rosengaus et al. ....... 356/237.4 |
| 6,078,380 | A | * | 6/2000 | Taniguchi et al. ........... 356/400 |
| 6,166,393 | A | * | 12/2000 | Paul et al. ............... 250/559.08 |
| 6,243,197 | B1 | | 6/2001 | Schalz ........................ 359/388 |
| 6,323,953 | B1 | * | 11/2001 | Blaesing-Bangert et al. ..... 356/614 |
| 6,466,315 | B1 | * | 10/2002 | Karpol et al. ............. 356/237.4 |
| 6,882,417 | B2 | * | 4/2005 | Goldberg et al. ......... 356/237.4 |

FOREIGN PATENT DOCUMENTS

| | | |
|---|---|---|
| DE | 34 04 810 | * 8/1985 |
| DE | 196 44 662 | 4/1998 |
| DE | 198 19 492 | * 11/1999 |
| WO | WO-02/15238 | 2/2002 |

OTHER PUBLICATIONS

European Search report dated Jul. 25, 2006 for European Patent Application 05 10 3661.

* cited by examiner

*Primary Examiner*—Gregory J. Toatley, Jr.
*Assistant Examiner*—Juan D Valentin
(74) *Attorney, Agent, or Firm*—Darby & Darby

(57) ABSTRACT

A measuring instrument for optical inspection of an object includes a light source for illuminating an object; a detector; an illuminating beam path extending from the light source to the object; a detection beam path extending from the object to the detector; an illuminating optics disposed in the illuminating beam path and/or an imaging optics disposed in the detection beam path for imaging the object onto the detector; a position evaluation device for determining a distance between two points of the object; and an optical device for imposing a profile of a continuously monotonic function on an intensity of light from the light source. The optical device is disposed in at least one of a pupil plane of the imaging optics, a pupil plane of the illuminating optics, and a plane in the illuminating or imaging beam path conjugate with the pupil plane of the imaging optics or the pupil plane of the illuminating optics.

18 Claims, 1 Drawing Sheet

MEASURING INSTRUMENT AND METHOD FOR OPERATING A MEASURING INSTRUMENT FOR OPTICAL INSPECTION OF AN OBJECT

Priority is claimed to German patent application DE 10 2004 023 739,5, filed May 12, 2004, the entire disclosure of which is hereby incorporated by reference herein.

The present invention relates to a measuring instrument and a method for operating a measuring instrument for optical inspection of an object such as, for example, a semiconductor substrate, an illumination mask or an optical data medium. The measuring instrument comprises a light source, an illuminating beam path, a detection beam path, an illuminating optics arranged in the illuminating beam path and/or an imaging optics arranged in the detection beam path, a detector and a position evaluation device. The illuminating beam path extends from the light source to the object, and the detection beam path extends from the object to the detector. At least one part of the object can be illuminated with light from the light source and can be imaged onto the detector with the imaging optics. The distance between two points of the object can be determined with the position evaluation device.

BACKGROUND

Measuring instruments of the above type have been known for some time; reference may be made purely by way of example to DE 198 19 492 A1, which discloses a measuring instrument. This measuring instrument serves a purpose of high precision measurement of the coordinates of patterns on substrates, for example masks, wafers, flat screens, vacuum-deposited patterns, semiconductor substrates, illumination masks or optical data media, in particular, however for transparent substrates. The coordinates are determined exactly to a few nanometers relative to a reference point. In this optical inspection technique, complex patterns of objects on flat substrates are inspected by image field. When objects are inspected by image field, the object is usually moved relative to the imaging optics with the aid of positioning means—in the form of positioning or measuring stages, for example—such that different areas of the object can also be detected.

A position evaluation device usually has means with which an object pattern can be detected and/or classified, with the aid of which a further object pattern at another point of the object—if appropriate, positioned with the positioning means at another position relative to the imaging optics—can likewise be detected and/or classified, and with which the position of the object patterns relative to one another can be determined. These means can, for example, be a CCD camera, a computer and an appropriate analysis and evaluation program, it being possible for the CCD camera to detect the image field of the object at a position and feed it to a computer in digitized form. An evaluation program running on the computer carries out the detection and/or classification of the object patterns with the aid of the digitized image data and object information possibly prescribed, as well as determining their distances.

Since the objects to be detected increasingly have smaller patterns, it is necessary to raise the optical resolution of the measuring instrument. This can be achieved by increasing the numerical aperture of the imaging optics and/or by reducing the wavelength of the light used for detection. The nominal resolution of an imaging optics can thereby be increased, above all for point objects, such that the diameter of the central diffraction maximum or of the classic diffraction disk can be reduced in the object illumination. However, both approaches to the solution encounter limits in principle that render a further increase in resolution very expensive. However, precision measurements of line patterns in a multiple resolution spacing are problematical, in particular, since the secondary maxima of the classic diffraction disk likewise impair the measurement of points of patterns which, starting from an initial point, are certainly not located at the spacing of the first diffraction minimum. The secondary maxima of the classic diffraction disk have a mutual spacing that far exceeds the resolving power of the imaging optics. The smaller the measuring error required, the greater must be the spacing of the measured patterns from the neighboring patterns. This results in a reduction of the effective resolution of the patterns by the measuring instrument.

SUMMARY OF THE INVENTION

It is therefore an object of the present invention to provide a measuring instrument and a method for operating a measuring instrument for optical inspection of an object, with the aid of which precision measurements are possible of extended patterns, in particular of line patterns, with a reduced measuring error.

The present invention provides a measuring instrument wherein there is provided in a pupil plane or in an aperture plane of the imaging optics and/or in a pupil plane or in an aperture plane of the illuminating optics or in a plane conjugate therewith or corresponding thereto, in the illuminating or imaging beam path, a means with which a profile of an at least in part continuously monotonic function can be impressed on the intensity of the light from the light source to a good approximation.

It has been recognized for the first time according to the invention that the nominal resolution of a measuring instrument of the type described above is misleading in the case of high-precision measurement of position and line widths precisely because the influences of the secondary maxima of the classic diffraction disk have a negative influence on the imaging properties, thus resulting in the measuring error being higher in fact than it actually should. The more accurate a measurement is to be, the more sensitive is the contribution of even small disturbances owing to neighboring patterns, particularly whenever they are caused by the secondary maxima of the classic diffraction disc.

In the inventive way, there is impressed on the intensity of the light a profile that—at least in part—corresponds to a continuously monotonic, preferably a strictly monotonic, function. What is meant here in particular, by this is that the function can have a substantially constant value in a segment, but in particular has no discontinuities or step function segments with reference to the functional values in dependence on the spatial coordinate. Such a mode of procedure is also termed apodization, and has long been known from the prior art when applied in optical microscopy or spectroscopy. Reference is made in this context, purely by way of example, to DE 34 04 810 A1, the entire disclosure of which is hereby incorporated by reference herein. In the case of measuring instruments of the type mentioned above and, in particular, in the case of lithography, operations have so far been performed using a so-called off-axis illumination that is usually implemented with the aid of an aperture (annular aperture) that is arranged in a plane conjugate with the pupil plane of the illuminating optics and that has a transmission characteristic of virtually 100% with the exception of an annular region with a transmission characteristic of approximately 0%. Such a binary illumination characteristic corresponds to a discontinuous function that generates a deflection disk of small diameter—and thus of high resolution—but non-negligible secondary maxima.

The illumination pattern can be varied in the object plane or in the focal plane of the imaging optics by skilful selection of an appropriate light intensity profile in a pupil plane of the illuminating optics that is a function of the nature of the illuminating optics. To this extent, the means can be designed in such a way that the secondary maxima are completely removed, in which case, however, there is an increase in the diameter of the classic diffraction disk or in the diffraction maximum. Consequently, the absorbing power of the measuring instrument is slightly reduced, although the measuring accuracy that can be achieved, is substantially raised. Such an illumination characteristic is, by contrast, entirely new for measuring instruments of the type mentioned at the beginning. In other words, the illuminating method known in conventional microscopy by the designation of apodization is applied to, or used for, measuring instruments for optical inspection of objects found in the semiconductor industry, or for optical inspection of synthetic objects. It is thereby possible in an advantageous way to carry out measurements that are of nanometer accuracy and have a reduced measuring error, the result being to improve the quantitative measurements overall.

The inventive measuring instrument can therefore serve the purpose, for example, of high-precision measurement of the coordinates of patterns on substrates, for example masks, wafers, flat screens, vapor-deposited patterns, semiconductor substrates, illumination masks or optical data media, but in particular for transparent substrates, the coordinates being determined accurately to a few nanometers relative to a reference point (optical inspection technique).

With regard to structure, the means could be designed, for example, in the form of a transmission filter that is arranged in a pupil plane of the imaging optics. In other embodiments the means could be another type of optical device.

The object could be illuminated in reflected light mode or in transmitted light mode. In the case of transmitted light illumination for transparent objects, the illumination is performed from one side of the object plane. For example, a Köhler illumination could be implemented with a UV light source and a condenser optics. Accordingly, the illuminating beam path covers the illuminating optics designed in the form of condenser optics, and extends from the light source up to the object. In this case, the detection or the imaging of the light transmitted through the object is performed by a detector arranged on the opposite side of the object plane, the detection beam path having an imaging optics—in the form of a microscope objective, for example—and extending from the object up to the detector.

In the case of reflected light illumination, which can also be applied in the case of nontransparent objects, both the illumination and the detection of the object are performed from the same side of the object. Thus, the light from a light source—via an intermediate optics if appropriate—illuminates the object, the illuminating light being directed onto the object through the imaging optics. In this case, the illuminating optics is at the same time the imaging optics in the illuminating beam path and detection beam path, respectively. The light reflected at the object is imaged onto a detector via the imaging optics, the detection beam path usually being separated from the illuminating beam path with the aid of a beam splitter.

In a preferred embodiment, the illuminating beam path or imaging beam path has an optical axis. The means can be used to reduce outward, that is to say in a radial direction, the light intensity of the illuminating or imaging beam path with reference to the optical axis. The reduction in light intensity can be performed using an arbitrary continuously monotonic function, it being possible for the function to depend on the properties of the illuminating and imaging optics as well as on the wavelength of the light used. Thus, for example, the function could have a range in which the intensity profile of the light is reduced linearly or quadratically. It is preferred that the light intensity can be set in accordance with the function $$I(r)=I_0*\cos^2(f*r/a)$$

$I_0$ being a prescribable intensity value dependent on the light source, f being a prescribable factor, r being the distance from the optical axis of the illuminating or imaging beam path in a radial direction, and a being the aperture diameter of the imaging optics. The factor f preferably has the value $\pi/2$. In the case of such a function profile, the secondary maxima are virtually completely eliminated, and the measuring errors are consequently minimized. The * in the function equation marks a mathematical multiplication. Such a function profile of the means could be implemented, for example, with a transmission filter that has a correspondingly non-transmitting or reflecting coating.

The measuring instrument could fundamentally be designed permanently with a means according to the invention and consequently always illuminate objects with the continuously monotonic light intensity profile in the pupil plane during all measuring operations. However, it can be advantageous for an object to be illuminated in a conventional way, on the one hand, and in the inventive way, on the other hand, and to be detected in each case. The object images thus detected can be fed to a statistical evaluation—an averaging, for example—so that the resulting measuring accuracy can be still further raised, something which is advantageous. For this purpose, the means could be introduced reversibly into the illuminating or imaging beam path, for example with the aid of a filter slide that is capable of moving a means designed in the form of a filter into the illuminating or imaging beam path and of moving it out thereof again.

Furthermore, the means could be of temporarily variable design such that the intensity of the light serving the purpose of object illumination can be varied temporarily with the means. In this case, the means could have an at least partially transparent LCD (Liquid Crystal Device) unit that can be used in a fashion driven by a control unit to implement a variable transmission characteristic of the LCD unit at different places.

The object to be detected is usually larger than the object area that can be imaged by the imaging optics. In a preferred embodiment, at least one positioning means is therefore provided that can be used to vary the relative position between the object and the imaging optics. Different areas of the object can therefore be positioned relative to the imaging optics in such a way that they are imaged onto the detector in each case. However, the path covered by the object during the positioning operation must be detected as accurately as possible, since this features directly in the measurement result. Consequently, it is preferably possible to detect interferometrically a variation, effected with the positioning means, in the relative position between the object and the imaging optics. In concrete terms, the positioning means could have an object displacement stage which can be used to position the object in at least two different directions. The object displacement stage could have subassemblies at least of one interferometer that can be used to determine the path difference between two object positions interferometrically. To this extent, it would be possible in this regard to use system components that are known from the prior art and such as are provided, for example, in DE 198 19 492 A1.

In an embodiment, the detector has a high-resolution CCD camera. The imaging optics could have a high resolution, apochromatically corrected microscope optics that is designed for illuminating light in the UV, preferably in the near UV. The measuring instrument thus equipped therefore has a high resolving power and a virtually error-free object imaging both with regard to optical imaging and with regard to detection of the object image.

The present invention also provides a method for operating a measuring instrument. At least one part of the object is illuminated with light from a light source and imaged onto a detector with an imaging optics. The distance between two points of the object is determined with a position evaluation device.

According to the invention, there is provided in a pupil plane of the imaging optics or of the illuminating optics or in a plane conjugate therewith in the illuminating or imaging beam path, a means with which the intensity of the light from the light source influences a profile of an—at least in part—continuously monotonic function.

As already indicated, the object could be detected at least in the case of a detection with an intensity distribution. In the case of a further detection, the object could be illuminated with a conventional—for example an off-axis—intensity distribution. The images thus detected could be fed to a statistical evaluation, thereby rendering it possible on the basis of the multiple detection and of the downstream statistical evaluation of the image data of the object to reduce the measuring error further and therefore to raise the accuracy of the quantitative measurement. Reference may be made to the preceding part of the description in order to avoid repetitions.

BRIEF DESCRIPTION OF THE DRAWINGS

There are various possibilities for refining and developing the present invention in an advantageous way. Reference may be made for this purpose to the following explanation of an exemplary embodiment of the invention with the aid of the drawing. In conjunction with the explanation of the exemplary embodiment of the invention on the basis of the drawing, refinements and developments of the teaching are also explained in general.

DETAILED DESCRIPTION

Figure 1:
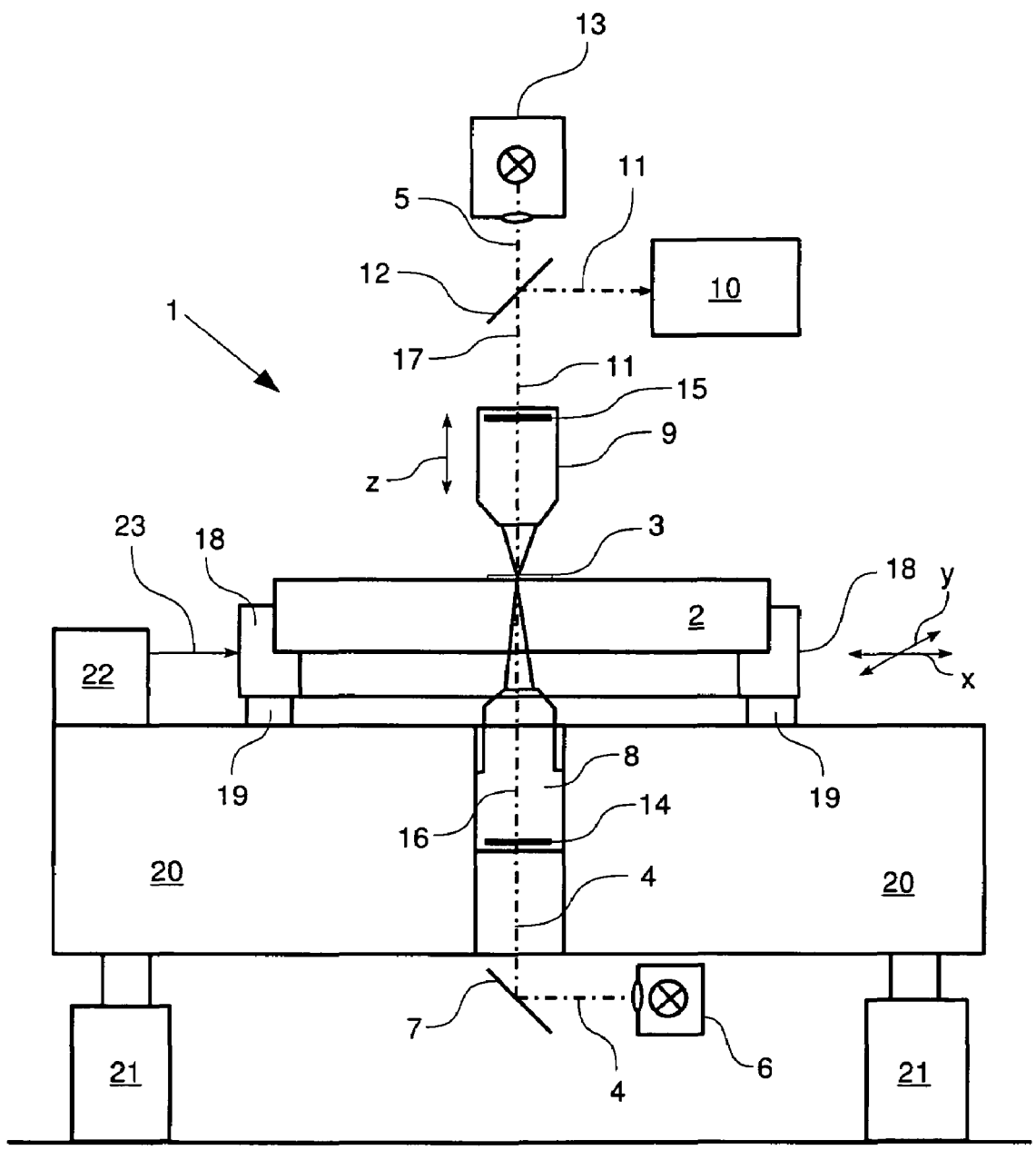
FIG. 1 shows a schematic of an exemplary embodiment of a measuring instrument according to the invention.

The sole FIGURE shows a measuring instrument 1 according to the invention with the aid of which object 2 can be inspected optically. The object 2 shown in the FIGURE is a mask that consists, for example, of silica glass. Applied to the mask are patterns 3 that are inspected with the measuring instrument 1. The measuring instrument 1 comprises two illuminating beam paths 4 and 5, the illuminating beam path 4 being provided for the transmitted light mode of the measuring instrument 1, and the illuminating beam path 5 for the reflected light mode of the measuring instrument 1. Provided for the transmitted light mode is a light source 6 that emits light in the near UV, and which light is reflected by the mirror 7 in the direction of the illuminating optics, which is designed in the form of a condenser 8. The light of the illuminating beam path 4 passes through the object 2 and is collected, at least for the most part, by the imaging optics 9 and imaged onto the detector 10. The detection beam path 11 therefore extends from the object 2 to the detector 10, the light coming from the object 2 being virtually completely reflected by the beam splitter 12 in the direction of the detector 10. The imaging optics 9 can be moved with a focusing device (not shown in the FIGURE) along the z-direction marked with the double arrow, as a result of which the object 2 or the patterns 3 can be focused. The condenser 8 can be moved in the same way along the z-direction.

The measuring instrument 1 also has a reflected light mode. In this mode, the illumination of the object 2 is performed as light from the light source 13, which for the most part passes through the beam splitter 12 and illuminates the object 2 via the imaging optics 9. In this mode, the illuminating light reflected at the object 2 or at the patterns 3 traverses the imaging optics 9 in the reverse direction and is likewise reflected at the beam splitter 12 in the direction of the detector 10. Consequently, the illuminating beam path 5 extends from the light source 13 to the object 2. The illuminating beam path 4 extends from the light source 6 to the object 2.

The imaging optics 9 is a high resolution, apochromatically corrected microscope optics that is designed for light in the near UV region. The detector 10 is designed in the form of a high resolution CCD camera and is driven and read out by a computerized evaluation and analysis system (not shown in the FIGURE).

According to the invention, the measuring instrument 1 has a means that is designed in the form of a filter 14 and 15 and is arranged in the illuminating beam path 4, on the one hand, and in the illuminating beam path 5, on the other hand. The filter 14 is arranged in the pupil plane of the illuminating optics, designed in the form of the condenser 8, in the illuminating beam path 4. The filter 15 is arranged in the pupil plane of the imaging optics 9 of the illuminating beam path 5. To this extent, the filter 15 also acts in the detection beam path 11, since in this exemplary embodiment, for example, it is not arranged between the light source 13 and the beam splitter 12.

The filters 14 and 15 are transmission filters that have a transmission characteristic in accordance with the function $$I(r)=I_0*\cos^2(f*r/a)$$

$I_0$ being a prescribable intensity value dependent on the light source 6, 13, f being a prescribable factor—which preferably has the value $\pi/2$—, r being the distance from the optical axis 16, 17 of the illuminating or imaging beam path 4, 5 in a radial direction, and a being the aperture diameter of the imaging optics 9 or of the illuminating optics 8. Consequently, the light intensity, present in the outer region of the transmission filters, of the transmitted light is less than the light intensity present at the optical axes 16, 17 of the illuminating beam paths 4 and 5. Although the filters 14 and 15 in the FIGURE are depicted as being assigned to the condenser 8 and the imaging optics 9, these could also be introduced reversibly into the respective beam path, for example respectively with the aid of a filter slide. They could also respectively be arranged in a plane in the illuminating beam paths 4, 5 that is conjugate with a pupil plane of the condenser 8 or of the imaging optics 9.

The object 2 is mounted in a positioning means 18 designed in the form of a measuring stage, and is mounted such that it can be moved along the different x- and y-directions marked with the two double arrows. The positioning means 18 has a frame into which the object 2 is laid. Indicated purely schematically is the laser interferometer system 22 with which it is possible to measure the position of the positioning means 18 interferometrically via the light beam 23. The frame of the positioning means 18 is mounted here on an air cushion 19 and can be moved virtually without friction on the granite block 20. The granite block 20 itself stands on the feet 21 mounted in a fashion to damp vibrations.

Finally, it may be pointed out that the exemplary embodiment discussed above serves only to describe the teaching claimed but does not restrict the latter to the exemplary embodiment.

LIST OF REFERENCE NUMERALS

1 Measuring instrument
2 Object
3 Patterns of (2)
4 Illuminating beam path
5 Illuminating beam path
6 Light source of (4)
7 Mirror
8 Condenser
9 Imaging optics
10 Detector
11 Detection beam path
12 Beam splitter
13 Light source of (5)
14 Filter for modulating the light intensity in (4)
15 Filter for modulating the light intensity in (5)
16 Optical axis of (4)
17 Optical axis of (5)
18 Positioning means
19 Air cushion for (18)
20 Granite block
21 Feet for (20)
22 Laser interferometer system
23 Light beam of (22)

What is claimed is:

1. A measuring instrument for measuring at least one of the position and width of an object, the measuring instrument comprising:
   a light source configured to illuminate at least a part of the object;
   a detector;
   an illuminating beam path extending from the light source to the object;
   a detection beam path extending from the object to the detector;
   at least one of an illuminating optics disposed in the illuminating beam path and an imaging optics disposed in the detection beam path, the imaging optics being configured to image the at least a part of the object onto the detector;
   a position evaluation device configured to determine a distance between two points of the object; and
   an optical device configured to impose a profile of a continuously monotonic function on an intensity of light from the light source and configured to reduce outwardly the light intensity of the illuminating or detection beam path with respect to a respective optical axis of the illuminating or detection beam path, the optical device being disposed in at least one of a pupil plane of the imaging optics, a pupil plane of the illuminating optics, and a plane in the illuminating or imaging beam path conjugate with the pupil plane of the imaging optics or the pupil plane of the illuminating optics.

2. The measuring instrument as recited in claim 1 wherein the object includes at least one of a semiconductor substrate, an illumination mask and an optical data medium.

3. The measuring instrument as recited in claim 1 wherein the light source is configured to illuminate the object in at least one of a reflected light mode and a transmitted light mode.

4. The measuring instrument as recited in claim 1 wherein the optical device includes a transmission filter.

5. The measuring instrument as recited in claim 1 wherein the optical device is configured to set the intensity of light from the light source in accordance with the function $$I(r)=I_0 * \cos^2(f*r/a)$$

wherein $I^0$ is a prescribable intensity value dependent on the light source, f is a prescribable factor, r is a distance from a respective optical axis of the illuminating or imaging beam path in a radial direction, and a is an aperture diameter of the imaging optics or of the illuminating optics.

6. The measuring instrument as recited in claim 5 wherein f has the value $\pi/2$.

7. The measuring instrument as recited in claim 1 wherein the optical device is capable of being reversibly disposed on the illuminating or imaging beam path.

8. The measuring instrument as recited in claim 1 wherein the optical device is capable of temporarily varying the intensity of the light from the light source.

9. The measuring instrument as recited in claim 8 wherein the optical device includes an at least partially transparent liquid crystal device drivable by a control unit to so as to implement a variable transmission characteristic.

10. The measuring instrument as recited in claim 1 further comprising at least one positioning device including a displacement stage configured to vary a relative position between the object and the imaging optics in at least two different directions.

11. The measuring instrument as recited in claim 10 wherein the object displacement stage includes at least one subassembly of at least one interferometer configured to determine a path difference between two positions of the object interferometrically.

12. The measuring instrument as recited in claim 1 wherein the detector includes a high-resolution CCD camera.

13. The measuring instrument as recited in claim 1 wherein the imaging optics includes a high resolution, apochromatically corrected microscope optics configured for illuminating light in a UV range.

14. The measuring instrument as recited in claim 13 wherein the UV range includes a near UV range.

15. A measuring instrument for optical inspection of an object, the measuring instrument comprising:
   a light source configured to illuminate at least a part of the object;
   a detector;
   an illuminating beam path extending from the light source to the object;
   a detection beam path extending from the object to the detector;
   at least one of an illuminating optics disposed in the illuminating beam path and an imaging optics disposed in the detection beam path, the imaging optics being configured to image the at least a part of the object onto the detector;
   a position evaluation device configured to determine a distance between two points of the object;
   an optical device configured to impose a profile of a continuously monotonic function on an intensity of light from the light source and configured to reduce outwardly the light intensity of the illuminating or detection beam path with respect to a respective optical axis of the illuminating or detection beam path, the optical device being disposed in at least one of a pupil plane of the imaging optics, a pupil plane of the illuminating optics, and a plane in the illuminating or imaging beam path conjugate with the pupil plane of the imaging optics or the pupil plane of the illuminating optics;

at least one positioning device configured to vary a relative position between the object and the imaging optics; and an interferometer configured to detect interferometrically a variation, effected with the at least one positioning device, in the relative position between the object and the imaging optics.

16. A method for operating a measuring instrument for optical inspection of an object, the measuring instrument including a light source; a detector, an illuminating beam path extending from the light source to the object, a detection beam path extending from the object to the detector, at least one of an illuminating optics disposed in the illuminating beam path and an imaging optics disposed in the detection beam path, and a position evaluation device, the method comprising:

illuminating at least a part of the object with light from the light source; imaging the at least a part of the object onto the detector using the imaging optics;

determining a distance between two points of the object with the position evaluation device; and providing an optical device in at least one of a pupil plane of the imaging optics, a pupil plane of the illuminating optics, and a plane in the illuminating or imaging beam path conjugate with the pupil plane of the imaging optics or the pupil plane of the illuminating optics, the optical device being configured to impress a profile of a continuously monotonic function on an intensity of light from the light source and configured to reduce outwardly the light intensity of the illuminating or detection beam path with respect to a respective optical axis of the illuminating or detection beam path.

17. The method as recited in claim 16 wherein the object is at least one of a semiconductor substrate, an illumination mask, and an optical data medium.

18. The method as recited in claim 16 further comprising:

detecting a first image of the at least a part of the object using a distribution of the intensity of light having the profile of the continuously monotonic function;

illuminating the at least a part of the object with a conventional intensity distribution and detecting a corresponding second image of the at least a part of the object; and performing a statistical evaluation on the first and second images.

* * * * *